US006345511B1

(12) United States Patent
Esty et al.

(10) Patent No.: US 6,345,511 B1
(45) Date of Patent: Feb. 12, 2002

(54) AIR HANDLING APPARATUS

(75) Inventors: James A. Esty, Hampton, NJ (US); Boris L. Muzikant, Pipersville, PA (US)

(73) Assignee: Kooltronic, Incorporated, Hopewell, NJ (US)

( * ) Notice: Subject to any disclaimer, the term of this patent is extended or adjusted under 35 U.S.C. 154(b) by 0 days.

(21) Appl. No.: 09/257,318

(22) Filed: Feb. 25, 1999

(51) Int. Cl.[7] .............................................. F25D 23/12

(52) U.S. Cl. ........................... 62/259.1; 62/263; 62/298

(58) Field of Search ............................... 62/259.1, 298, 62/263

(56) References Cited

U.S. PATENT DOCUMENTS

| 3,357,763 A | * 12/1967 | Toper ........................... 62/298 |
| 3,394,560 A | 7/1968 | Glickman |
| 3,838,579 A | 10/1974 | Ballard |

(List continued on next page.)

FOREIGN PATENT DOCUMENTS

| DE | 19 83 716 U | 4/1968 |
| DE | 93 01 215 U | 8/1993 |
| EP | 0 979 978 A2 | 2/2000 |
| JP | 58-102034 | 6/1983 |
| JP | 59-122833 | 7/1984 |
| JP | 59-150233 | 8/1984 |
| JP | 2-101333 | 4/1990 |
| JP | 4-225735 | 8/1992 |
| JP | 5-296487 | 11/1996 |
| JP | 9-217943 | 8/1997 |
| JP | 10-9610 | 1/1998 |

OTHER PUBLICATIONS

M/Tab Mounting Template and Assembly Bracket.
Japanese Abstract, 10–009610A, Jan. 16, 1998.
Japanese Abstract, 05–296487, Nov. 9, 1993.
Japanese Abstract, 05–102034, Jun. 17, 1983.
Partial European Search Report corresponding to European counterpart EP 00 30 1503.
Japanese Abstract, 59–122833A, Jul. 16, 1984.
Japanese Abstract, 59–150233, Aug. 28, 1984.
Japanese Abstract, 02–101333, Apr. 13, 1990.
Japanese Abstract, 04–225735, Aug. 14, 1992.
Japanese Abstract, 09–217943, Aug. 19, 1997.
European Search Report corresponding to European counterpart EP 00 30 1503.

*Primary Examiner*—William Doerrler
*Assistant Examiner*—Mark Shulman
(74) *Attorney, Agent, or Firm*—Morgan & Finnegan, LLP

(57) ABSTRACT

An air handling apparatus and method for installation where a cabinet is connected to a mounting plate with a mounting bracket, the mounting plate is attached to an electrical equipment enclosure. Gravity and latching screws secure the cabinet to the mounting plate and also facilitate a seal between the cabinet and the enclosure. After connection of the cabinet to the mounting plate, the mounting plate and mounting brackets are concealed from view by the cabinet and enclosure. The mounting bracket is a combination of hooks and slots. Panel elements of the cabinet are interconnected using a combination of hooks and slots with seals compressed between the panels. The cabinet includes a horizontally disposed evaporator coil, the evaporator coil between an evaporator blower and a condenser blower. Air conditioning elements are vertically stacked within the cabinet. Airflow in the cabinet is generally upward in both the internal and external circulation regions. Condensate formed on the evaporator coil is evaporated within the cabinet and discharged to the outside in the heated exhaust airflow. An exhaust air grill turns the exhaust airflow from downward to substantially horizontal, to reduce mixing of inlet and exhaust air.

68 Claims, 9 Drawing Sheets

U.S. PATENT DOCUMENTS

| | | |
|---|---|---|
| 4,202,389 A | 5/1980 | Ewald |
| 4,389,827 A | 6/1983 | Van Valkenburg |
| 4,424,686 A | 1/1984 | Lapeyre et al. |
| 4,475,358 A | 10/1984 | Seifert et al. |
| 4,507,940 A * | 4/1985 | Sato et al. .................... 62/407 |
| 4,544,023 A * | 10/1985 | Marciniak .................... 165/48 |
| 4,573,328 A | 3/1986 | Bolton et al. |
| 4,607,500 A | 8/1986 | Bolton et al. |
| 4,733,542 A | 3/1988 | Blair |
| 5,036,677 A | 8/1991 | Neuenfeldt et al. |
| 5,191,770 A * | 3/1993 | Kim .............................. 62/263 |
| 5,203,400 A | 4/1993 | Tsunekawa et al. |
| 5,277,039 A | 1/1994 | Haasis |
| 5,361,981 A | 11/1994 | Albert et al. |
| 5,421,550 A * | 6/1995 | Palmer ........................ 248/200 |
| 5,657,641 A * | 8/1997 | Cunningham et al. ......... 62/263 |
| 5,755,107 A | 5/1998 | Shirota et al. |
| 5,755,109 A * | 5/1998 | Kim .......................... 62/259.1 |
| 5,801,632 A | 9/1998 | Opal |
| 5,996,366 A * | 12/1999 | Renard ........................ 62/256 |

\* cited by examiner

AIR HANDLING APPARATUS

BACKGROUND OF THE INVENTION

1. Field of the Invention

The invention relates to the field of air handling and more particularly to externally attached cabinets and their apparatus for filtering, heating, cooling and dehumidifying air within equipment enclosures.

2. Background Information

Control of the climate or environment within equipment enclosures is known and is commonly accomplished with an air conditioning system. The air conditioning system is either part of the building support equipment or it is attached to the exterior of the electrical equipment enclosure to provide conditioned air to the enclosure. In the field, most air conditioning systems recirculate the air within the equipment enclosure and do not allow significant mixing of outside air with inside air. In temperate regions, the air conditioning system typically removes humidity from the recirculated air at the same time it cools the air within the electrical equipment enclosure. The systems may also include filters to remove particulate in the recirculated air. In cold areas, the air conditioning system may alternatively heat the recirculated air and/or add moisture. When the systems heat the air, heating is normally accomplished with a heat pump, which is able to perform both heating and cooling functions.

An objective when controlling the recirculated air environment within the electrical equipment enclosure is to create and maintain an environment inside the enclosure that is different than the environment outside the enclosure. This objective is economically accomplished by recirculating the air and by reducing or eliminating the mixing of inside and outside air. Seals between inside and outside help eliminate mixing.

U.S. Pat. No. 5,657,641, issued to Cunningham et al. (the '641 patent), the disclosure of which is hereby incorporated by reference, discloses an apparatus to create and maintain an environment within an equipment enclosure. As described in the '641 patent, it is known to attach a cabinet to the exterior of an equipment enclosure, the cabinet containing heating, cooling and/or filtering equipment. The heating, cooling and/or filtering equipment typically includes blowers, a compressor, a condenser coil and an evaporator coil, and ducting to direct air flows through the condenser coil and evaporator coil to heat and cool the respective air streams. It is also common for condensate to form on the evaporator coil, which may drip from the evaporator coil into some form of collection pan. Depending on the application, the condensate is either drained from the cabinet or evaporated within the cabinet.

In most applications, introduction of condensate from the air conditioning cabinet into the electrical equipment enclosure is damaging and potentially dangerous. For many of these applications, condensate discharge either inside the cabinet or outside the cabinet is unacceptable. Thus, it is appropriate and advantageous to ensure that all condensate is evaporated within the cabinet during operation. Therefore, configurations that minimize or avoid the possibility of condensate entering into the electrical equipment enclosure are appropriate and advantageous.

When the cabinet is mounted on the exterior of the equipment enclosure it is subject to any local weather effects, such as rain, sleet, snow and wind. It is therefor necessary for the cabinet and enclosure to have suitable connections and seals. When securely connected to the enclosure, the cabinet and enclosure should not be separated in high winds, and precipitation should not enter either the cabinet or enclosure. Though it is common for the air conditioning cabinet to be mounted on the side of the electrical equipment enclosure, it is also possible to mount the cabinet on the top of the enclosure. Depending on the mounting location, the internal orientation of air conditioning equipment in the cabinet changes.

When an air conditioning cabinet is externally mounted to the equipment enclosure, the construction quality of the cabinet is visible. The connection of the air conditioning cabinet to the equipment enclosure is also visible. Previously known mounting configurations include an external flange arrangement such as disclosed in the '641 patent. In the flange arrangement disclosed in the '641 patent, screws or bolts attaching the cabinet to the enclosure are exposed to view and the environment. This exposed flange mounting configuration can be less attractive. Additionally, screws or bolts may corrode unless they are corrosion resistant. Mounting configurations that provide a pleasing and uncluttered appearance, are advantageous.

Apparatus and methods for air handling that address these and other problems are needed.

BRIEF SUMMARY OF THE INVENTION

In one aspect, an air handling apparatus comprises a mounting plate that is adapted to attach to an electrical equipment enclosure. A cabinet is adapted to connect to the mounting plate and also adapted to contact the enclosure. At least one mounting bracket cooperates between the mounting plate and the cabinet to thereby connect the cabinet to the mounting plate. At least one latching screw moves the cabinet relative to the mounting plate in a combined direction toward the enclosure and along the enclosure. A compressible seal between the cabinet and the enclosure provides an environmental seal against weather effects. After the movement, the mounting plate and mounting bracket are substantially concealed by the cabinet. This advantageously presents a pleasing non-industrial appearance.

In another aspect, individual panels are joined to each other with a mounting bracket, comprising a combination of hooks and slots. A compressible seal between the panels provides an environmental seal against weather effects after the panels are joined.

In another aspect, an injection molded plastic grill for the apparatus comprises a combination of guide plates, diverter plates and blocking plates, which are joined to each at varying angles. The different plates turn an airflow that exits the apparatus to a more horizontal direction. The different plates also stiffen the grill.

In another aspect, an air handling apparatus comprises an internal circulation region of the apparatus, with an evaporator coil horizontally disposed within the internal circulation region. A condensate pan is also within the internal circulation region and disposed below the evaporator coil. There is an external circulation region of the apparatus, and a condensate evaporator pan within the external circulation region. The condensate evaporator pan is disposed below the condensate pan. A condensate passage connects the condensate pan with the condensate evaporator pan. The internal circulation region is substantially sealed from the external circulation regions except for the condensate passage. A condenser blower within the external circulation region is disposed below the condensate evaporator pan. Air circulated by the condenser blower in the external circulation region aids in evaporation of condensate in the condensate evaporator pan. This advantageously eliminates condensate without a liquid discharge from the cabinet.

In another aspect, an air handling apparatus comprises an internal circulation region of the apparatus with an evaporator blower disposed within the internal circulation region. An evaporator coil is disposed within the internal circulation region and below the evaporator blower. The evaporator coil is oriented in a substantially horizontal direction, the orientation of the evaporator coil allowing airflow within the internal circulation region to enter the evaporator coil at a lower surface and exit the evaporator coil at an upper surface. A condensate pan within the internal circulation region is disposed below the evaporator coil. An external circulation region of the apparatus is substantially sealed from the internal circulation region. A condenser blower is within the external circulation region and is disposed below the condensate pan. A condenser coil is within the external circulation region and is disposed below the condenser blower. A compressor within the external circulation region is disposed below the condenser coil. The orientation of evaporator blower, evaporator coil, condensate pan, condenser blower, condenser coil and compressor is one above the other. The velocity of airflow through the evaporator coil as a result of the evaporator blower is sufficiently low that any condensate formed on the evaporator coil drips into the condensate pan. This advantageously provides a compact and visually pleasing cabinet while reducing the probability that condensate will enter the electrical equipment enclosure.

The foregoing specific objects and advantages of the invention are illustrative of those which can be achieved by the present invention and are not intended to be exhaustive or limiting of the possible advantages which can be realized. Thus, the objects and advantages of this invention will be apparent from the description herein or can be learned from practicing the invention, both as embodied herein or as modified in view of any variations which may be apparent to those skilled in the art. Accordingly, the present invention resides in the novel parts, constructions, arrangements, combinations and improvements herein shown and described.

BRIEF DESCRIPTION OF THE DRAWINGS

The foregoing features and other aspects of the invention are explained in the following description taken in connection with the accompanying drawings wherein.

It is understood that the drawings are for illustration only and are not limiting.

DETAILED DESCRIPTION OF THE INVENTION

Figure 1:
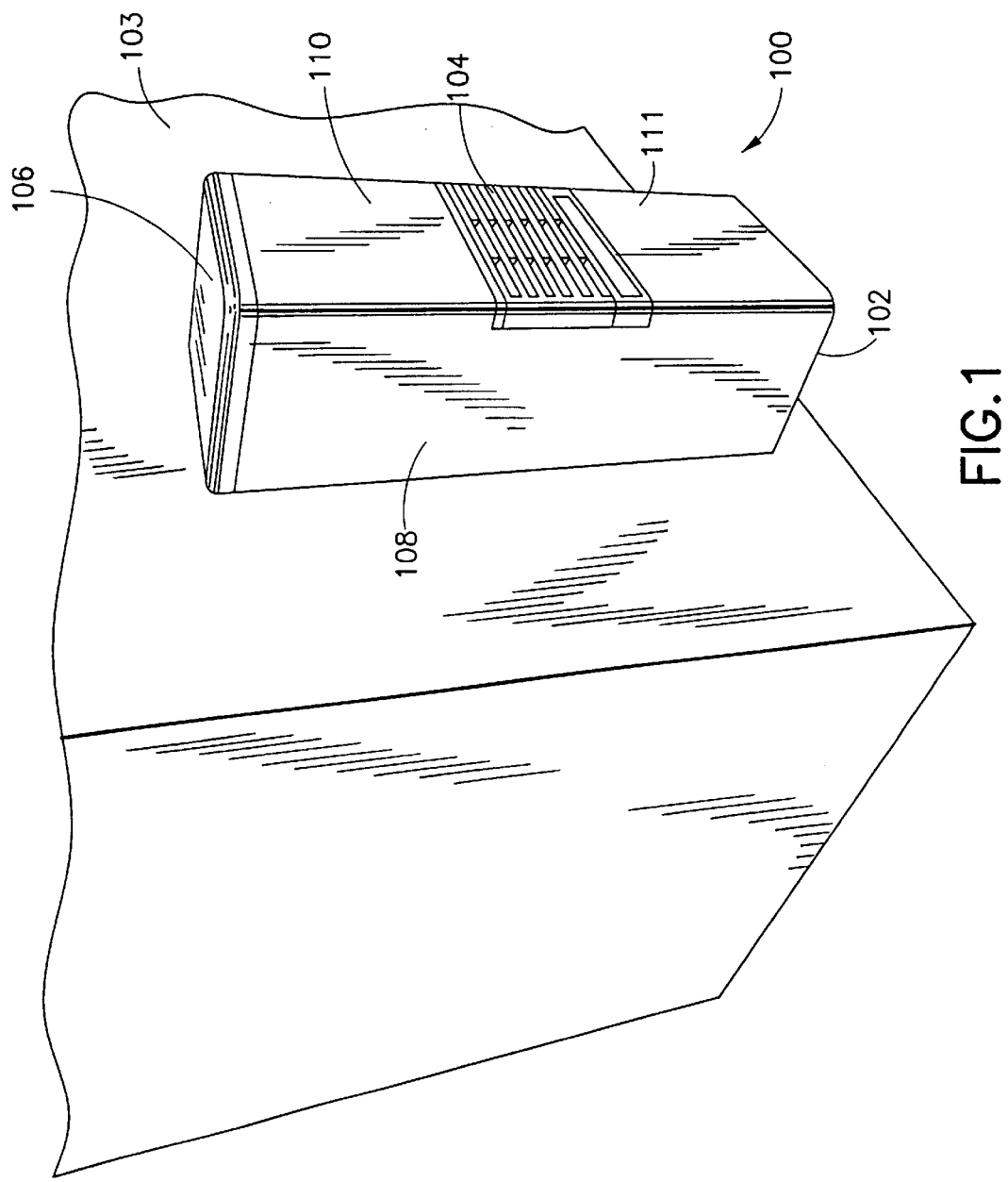
FIG. 1 illustrates an exterior view of an embodiment of a cabinet of the invention as installed on an enclosure.

FIG. 1 illustrates an air conditioning cabinet 100 attached to the exterior of an electrical equipment enclosure 103. In one particular application, enclosure 103 provides a sheltered environment for electrical equipment such as transmitters, receivers and switching or routing equipment for cellular telephone equipment. With cellular equipment, enclosure 103 may be located in many different environments and must be visually acceptable or inconspicuous within those environments. In an urban environment, a suitable design for enclosure 103 requires a non-industrial appearance. When cabinet 100 is attached to enclosure 103 in an urban environment, a similarly non-industrial appearance of cabinet 100 is required. Many of the features of cabinet 100, described herein, contribute to a non-industrial appearance.

Enclosure 103 contains electrical equipment and cabinet 100 contains air handling equipment. By locating the air handling equipment within cabinet 100, there is no need to provide space for air handling equipment within enclosure 103. This allows close packing of the equipment within enclosure 103. However, the close packing increases the heat load from electrical equipment within enclosure 103, and makes it difficult to gain access to the walls of enclosure 103 once the equipment is installed within the enclosure. For these reasons, configurations that allow surface mounting of cabinet 100 on a wall of enclosure 103 are particularly advantageous. Configurations that allow a worker to mount cabinet 100 to enclosure 103, without requiring significant access to the inside of enclosure 103 are also advantageous. Some access to the interior of enclosure 103 may be available, such as for example reaching into enclosure 103 through air vents in the side of enclosure 103.

At times, the air handling equipment inside cabinet 100 requires maintenance or repair away from enclosure 103. In those instances, it is an advantage if cabinet 100 can be easily removed and a replacement unit installed, without significant labor.

As illustrated, cabinet 100 and enclosure 103 are in close contact with each other. Cabinet 100 does not rest on the ground or surface around enclosure 103, but is mounted sufficiently above the ground to provide a clear air path around the bottom of cabinet 100. The clear air path allows outside air to enter cabinet 100 at the bottom through inlet vent 102. Locating the inlet vent 102 at the bottom of cabinet 100 helps to prevent direct entry of precipitation such as rain or snow.

When cabinet 100 is mounted to the exterior of enclosure 103, the cabinet configuration conceals the actual mounting of the cabinet to the enclosure. Additionally, the panels of cabinet 100 are configured so as to conceal their connections. These construction details help provide a non-industrial appearance. The details of the panel configuration and mounting configuration are described below in greater detail.

Cabinet 100 includes external circulation region inlet vent 102 and exhaust vent 104. Inlet vent 102, on the bottom of cabinet 100, is not visible in FIG. 1. The external circulation region of cabinet 100 communicates with the exterior environment through vents 102 and 104.

Figure 2:
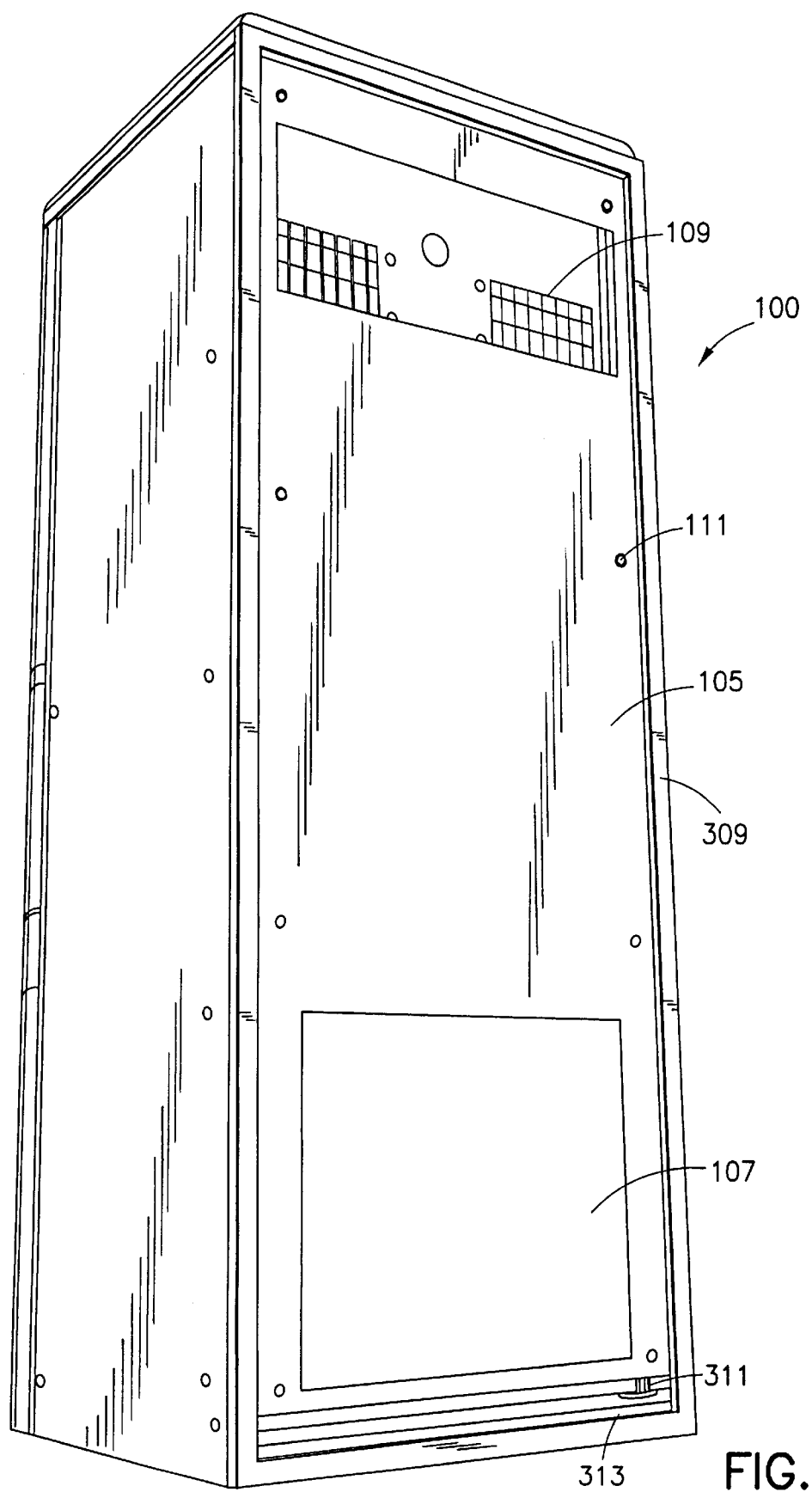
FIG. 2 illustrates a mounting side view of an embodiment of a cabinet of the invention.
Figure 3:
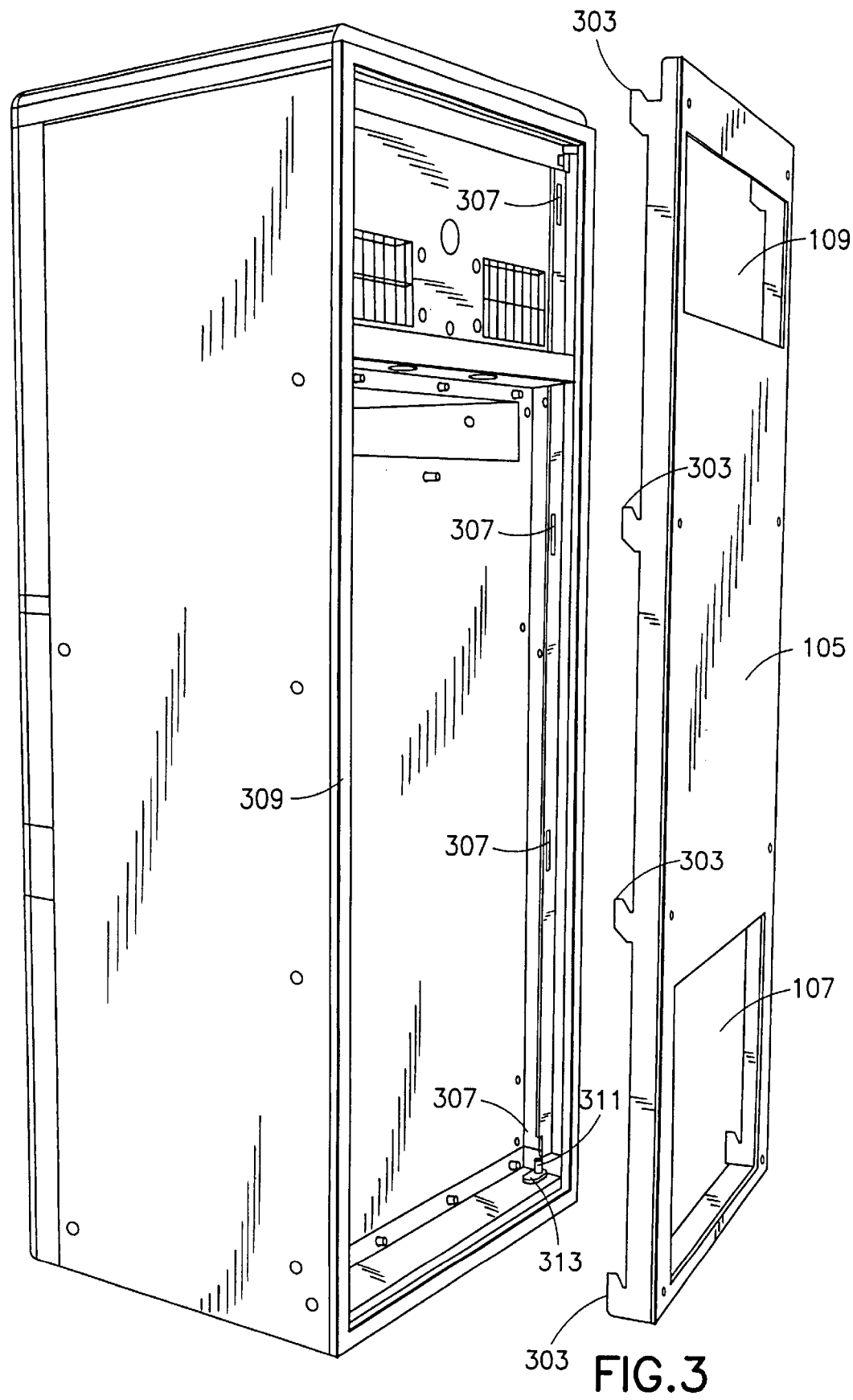
FIG. 3 illustrates a mounting side view of an embodiment of mounting brackets of the invention.

FIGS. 2 and 3 illustrate air conditioning cabinet 100 from the electrical equipment enclosure side. During installation, mounting plate 105 is attached to enclosure 103 using holes 111. Once mounting plate 105 is attached to enclosure 103, cabinet 100 is connected to mounting plate 105. The connection of cabinet 100 to mounting plate 105 results in attachment of cabinet 100 to enclosure 103.

Mounting plate 105 includes an air inlet 107 and an air outlet 109. Typically, warm humid air from electrical equipment enclosure 103 enters cabinet 100 through inlet 107 and after dehumidification and cooling, the conditioned air exits cabinet 100 through outlet 109. The cooled dehumidified air that enters electrical equipment enclosure 103 from outlet 109 circulates through enclosure 103 where it is warmed and eventually completes the cycle as recirculated air by reentering cabinet 100 through inlet 107.

Mounting plate 105 is made of sheet metal and includes a number of holes 111 for screw or bolt attachment of mounting plate 105 to enclosure 103. Prior to attaching mounting plate 105 to enclosure 103, at least two air vent holes are created in enclosure 103 that correspond with inlet 107 and outlet 109 of mounting plate 105. After the holes are created, mounting plate 105 is directly mounted to enclosure 103. Normally, mounting plate 105 is fixed to enclosure 103 with bolts and nuts. A worker gains access to the interior of enclosure 103 by reaching through the two air vent holes to connect the bolts and nuts using holes 111, thereby completing the installation.

A mounting bracket in the form of hooks on mounting plate 105 connects cabinet 100 to mounting plate 105. The hooks are illustrated in FIG. 3. A number of hooks 303 extend from the sides of plate 105. Hooks 303 have about a 30 degree angle from vertical.

Cooperating with hooks 303, cabinet 100 has a series of slots 307 along the sides of the cabinet. After plate 105 is securely attached to enclosure 103, as described above, cabinet 100 is positioned with reference to plate 105 so that hooks 303 align with slots 307. Once positioned, cabinet 100 is moved toward enclosure 103 causing hooks 303 to connect with slots 307. The weight of cabinet 100 and the angle of hooks 303 causes cabinet 100 to be drawn toward enclosure 103 while at the same time moving down along enclosure 103. This combined movement of cabinet 100 with respect to enclosure 103 slightly compresses seal 309 between cabinet 100 and enclosure 103. Seal 309 is a compressible dense foam tape with an adhesive backing to attach the seal to a flange on cabinet 100. Compression of seal 309 achieves and maintains the seal between cabinet 100 and enclosure 103. Seal 309 is further compressed using latching screws, as described below.

The relationship of plate 105 and cabinet 100 is such that when cabinet 100 is connected to plate 105, and plate 105 is attached to enclosure 103, plate 105 is concealed from view, and only enclosure 103 and cabinet 100 are visible. Concealment of plate 105 has the advantage of shielding plate 105 and any attachment screws or bolts from weather or corrosion effects, while at the same time providing a pleasing non-industrial appearance.

As described, cabinet 100 is connected to enclosure 103 by a mounting bracket (the hooks 303 of plate 105). However, using only a mounting bracket, the connection is only maintained by gravity and cabinet 100 could be easily lifted up and away from the enclosure, thereby separating cabinet 100 and enclosure 103. To increase the compression of the seal between cabinet 100 and enclosure 103, and thereby improve the environmental seal between enclosure 103 and cabinet 100, latching screws 311, coupled with weldnuts 313 allow cabinet 100 to be tightened on plate 105 and thus latched to plate 105. Latching screws 311 are accessible from the bottom of cabinet 100 after cabinet 100 is connected to plate 105, to allow connection and tightening of cabinet 100 to plate 105. Latching screws 311 have the additional effect of drawing cabinet 100 and plate 105 closer together, which results in additional compression of seal 309 between cabinet 100 and enclosure 103.

Figure 5:
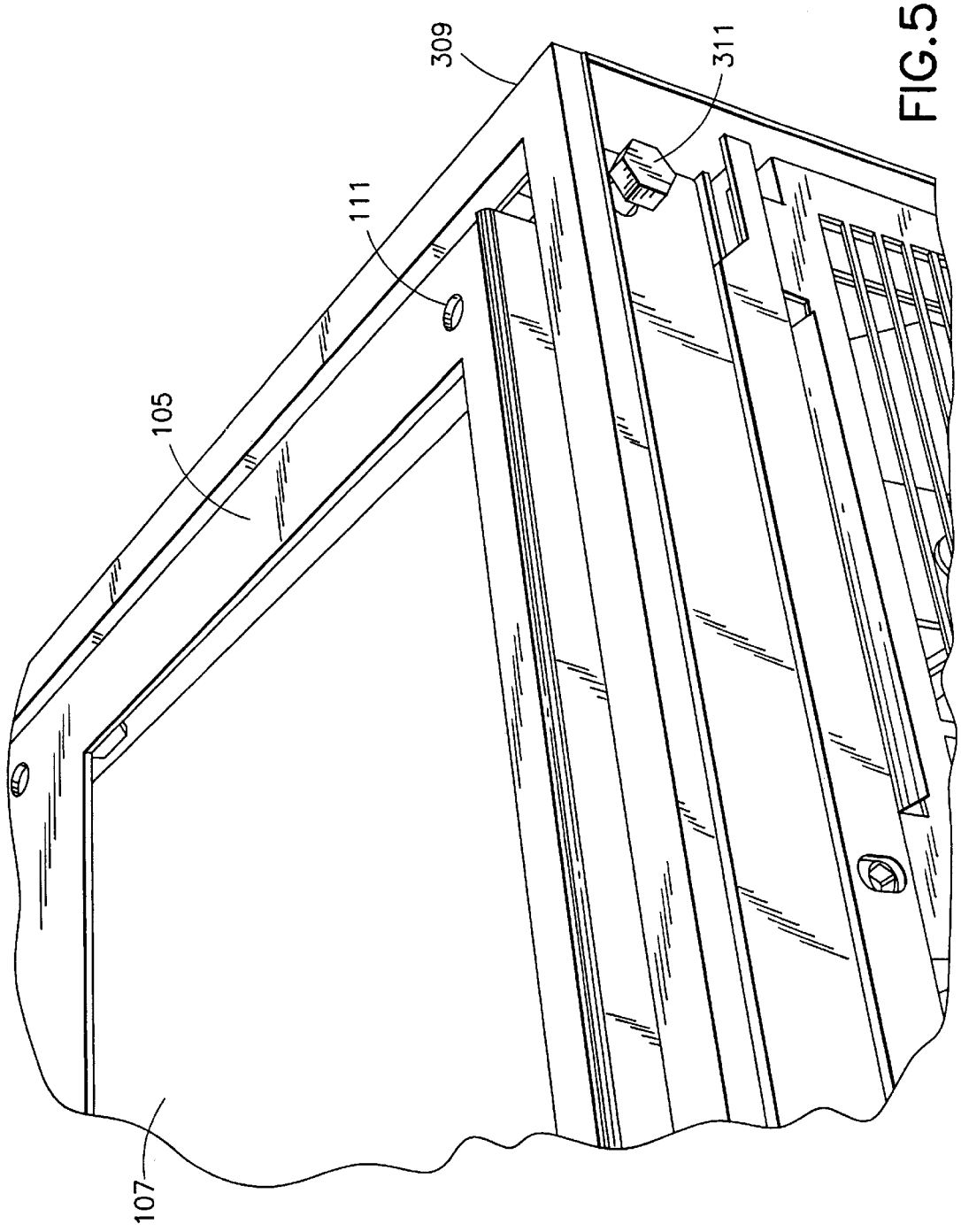
FIG. 5 illustrates a bottom view of an embodiment of a cabinet of the invention.

Referring to FIG. 5, as latching screws 311 are tightened from the bottom of cabinet 100, the threaded end of each screw is extended upward from weldnuts 313. As the threaded end extends it contacts plate 105. As the latching screws are further tightened, they exert pressure on plate 105. The pressure forces plate 105 and cabinet 100 to move relative to each other. The relative movement of cabinet 100 is a combination of downward and horizontal movement as a result of the angle of hooks 303 cooperating with slots 307. Plate 105 is fixed to enclosure 103 and the downward movement of cabinet 100 relative to plate 105 is along enclosure 103. The horizontal movement of cabinet 100 is toward enclosure 103. This combined movement further compresses seal 309 between cabinet 100 and enclosure 103.

In the embodiment thus illustrated and described, an environmental seal is created between cabinet 100 and enclosure 103 through the interaction of plate 105, cabinet 100 and enclosure 103. The effect of this environmental seal between cabinet 100 and enclosure 103 is to substantially prevent entry of water, air and dust into cabinet 100 and enclosure 103.

Cabinet 100 is constructed using multiple panels that are connected to each other and sealed to each other using a combination of hooks, slots, seals and attaching screws. This configuration of individual panels is illustrated in FIG. 1. A top panel 106 contacts side panels 108. Upper rear panel 110 and lower rear panel 111 also contact side panels 108. Grill 113 is between upper rear panel 110 and lower rear panel 111.

Side panels 108 are attached to an inner frame of cabinet 100 using traditional studs, screws and bolts. Side panels 108 have a series of slots which cooperate with respective hooks in upper rear panel 110 and lower rear panel 111.

Figure 6:
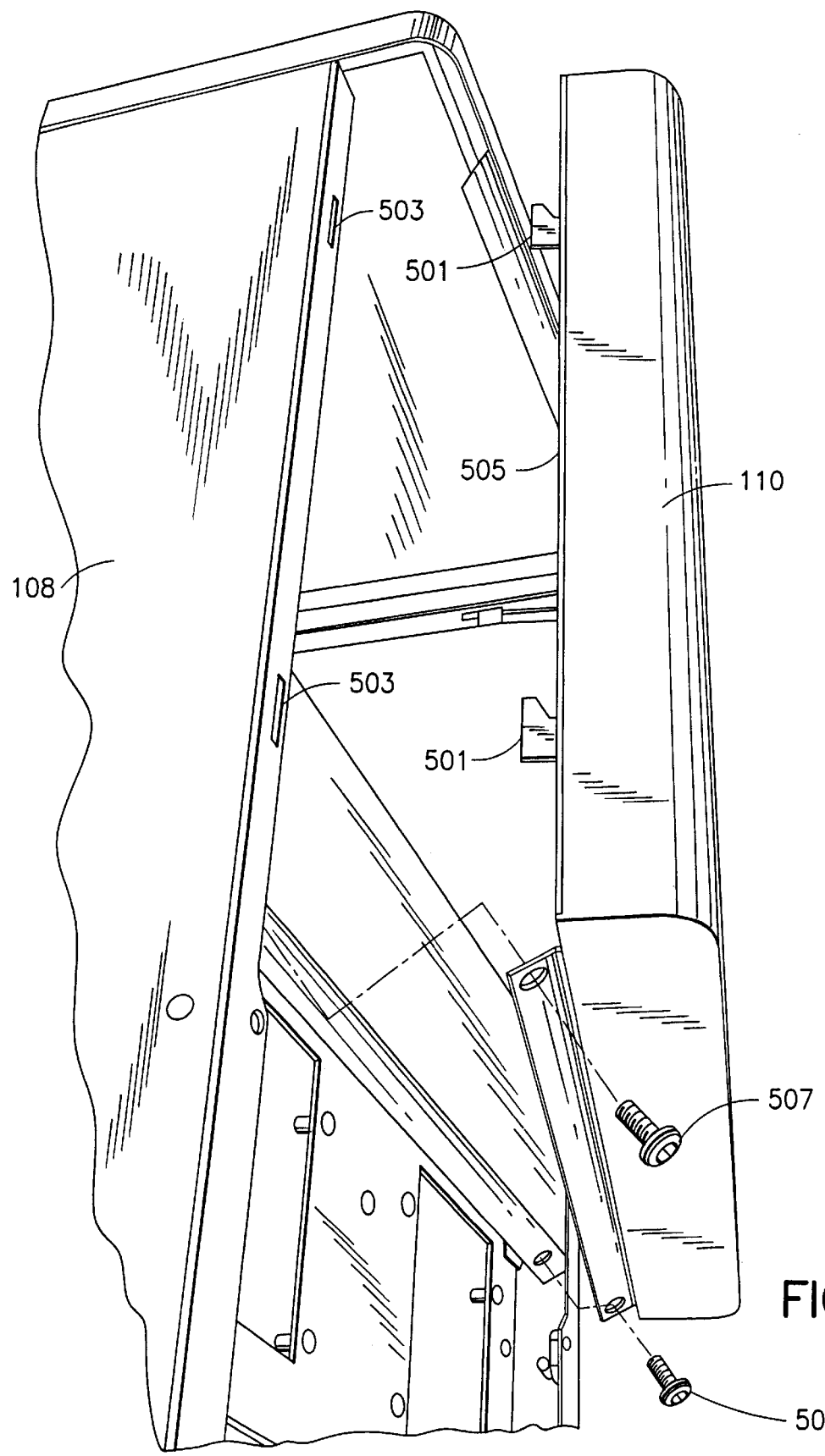
FIG. 6 illustrates a configuration for attaching rear panels to the cabinet of the apparatus.

Referring to FIG. 6, upper rear panel 110 has multiple upward directed hooks 501, which cooperate with multiple slots 503. A seal 505 is adhesively attached to panel 110 and is compressed between rear panel 110 and side panels 108 as the hooks engage the slots. Upper rear panel 110 moves both upward, along side panels 108 and toward side panels 108 as it is attached to side panels 108 by the components of force applied by screws 507. This combined movement compresses seal 505 as upper rear panel 110 moves into proper alignment and creates an environmental seal between panel 110 and panels 108. After seal 505 is compressed, panel 110 is secured in position with screws 507.

Similarly, lower rear panel 111 has multiple downward directed hooks, which cooperate with multiple slots. A seal is adhesively attached to lower rear panel and is compressed between the lower rear panel and the side panels as the hooks engage the slots and the rear panel moves relative to the side panels. Lower rear panel moves both downward along side panels and toward side panels as it is attached to the side panels by the screws. This combined movement as lower rear panel is aligned with side panels compresses the seal and creates an environmental seal between the lower rear panel and the side panels. After the seal is compressed, lower rear panel is also secured in position with screws.

Figure 7:
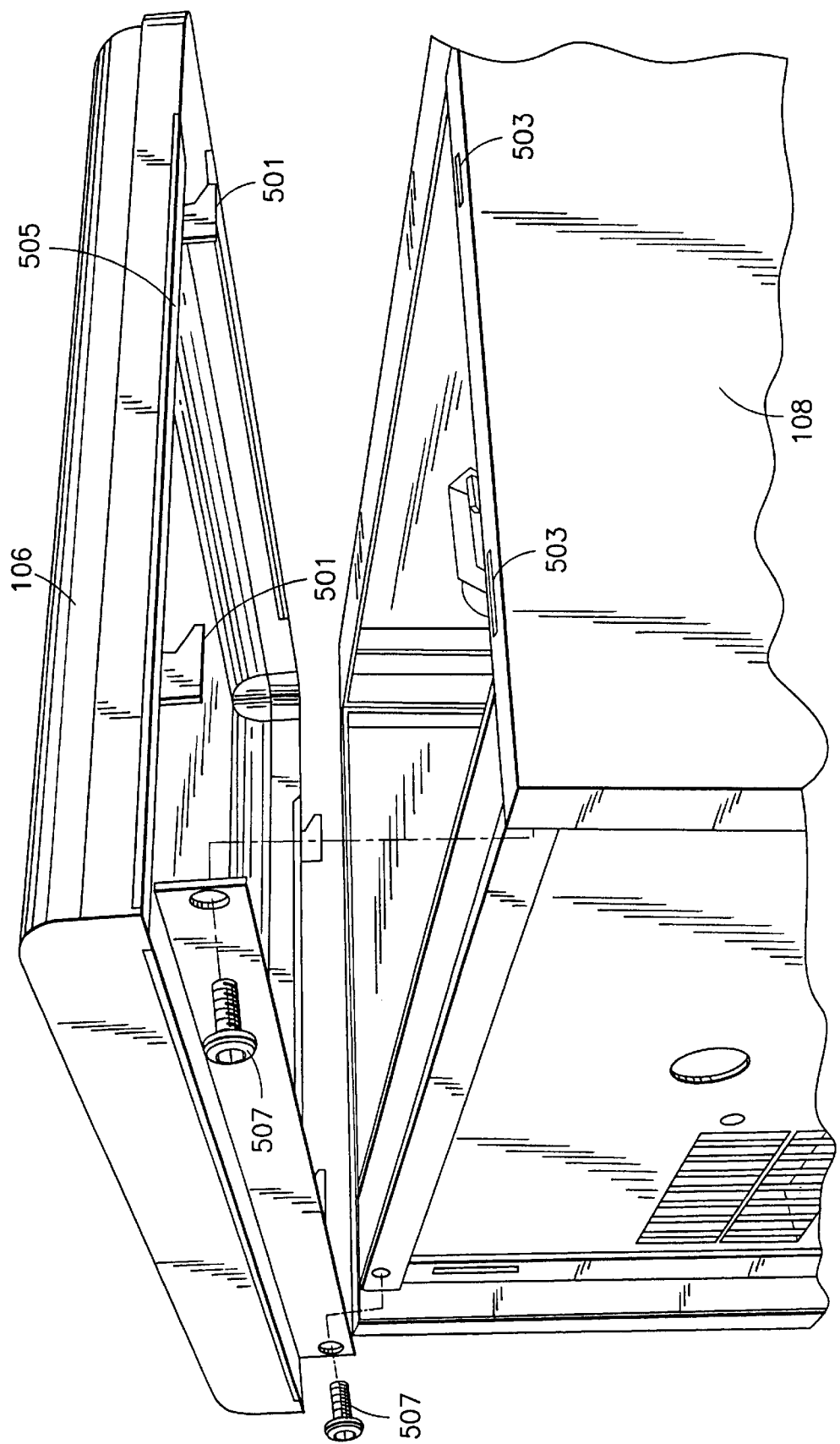
FIG. 7 illustrates a configuration for attaching a top panel to the cabinet of the apparatus.

Referring to FIG. 7, top panel 106 is similarly attached to side panels 108 with hooks 501 and slots 503. A seal 505 is similarly compressed between panels 108 and panel 106. During installation and alignment, top panel 106 moves both along and toward side panels 108. This combined movement compresses seal 505 to create an environmental seal between top panel 106 and side panels 108 as it is attached by screws 507.

Figure 8:
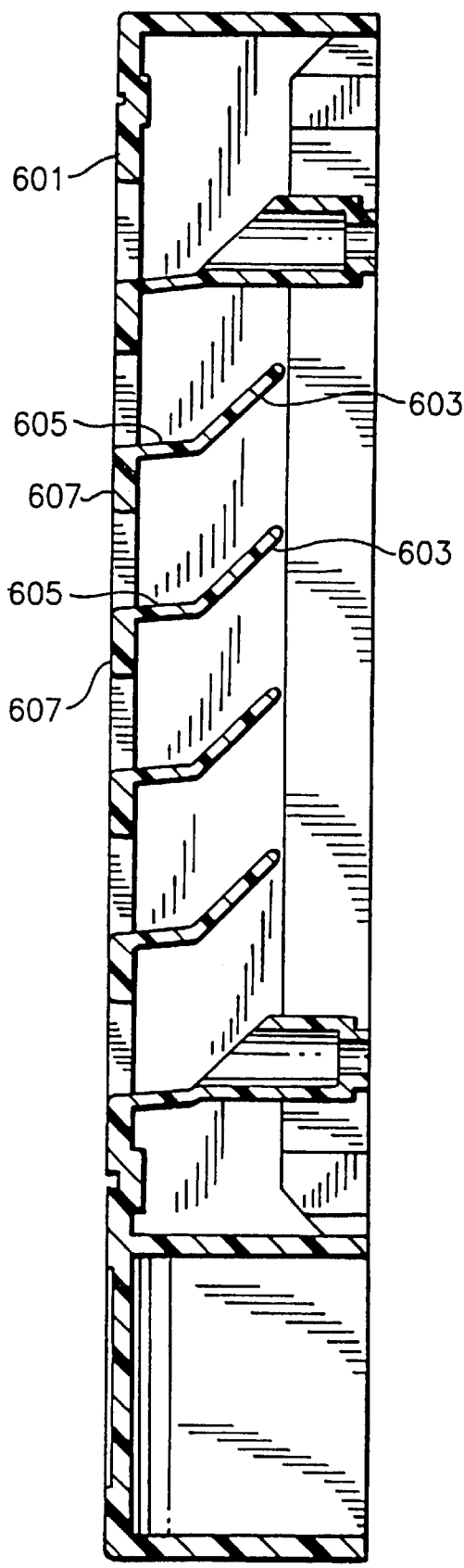
FIG. 8 illustrates a cross-section view of a configuration of a grill for the invention.
Figure 9:
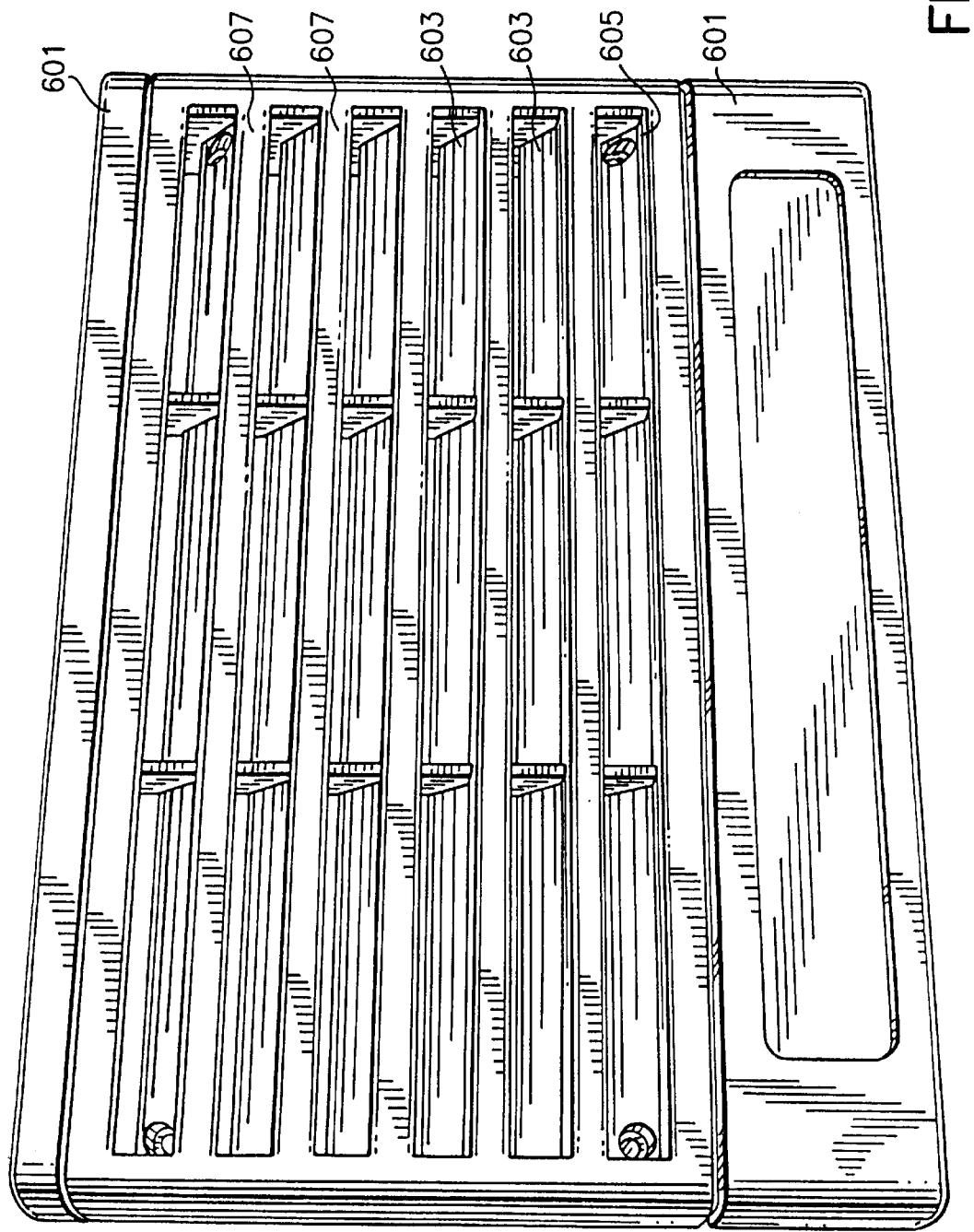
FIG. 9 illustrates a view of a configuration of a grill for the invention.

Grill 601, which is screwed to cabinet 100 between upper rear panel 110 and lower rear panel 111, is configured to direct exhaust air down and away from cabinet 100. FIG. 8 illustrates grill 601 in cross section. FIG. 9 illustrates grill 601 as mounted to cabinet 100. The configuration of a condenser blower inside cabinet 100 directs exhaust air down and away from cabinet 100. As the exhaust airflow enters grill 601, it is primarily parallel to guide plates 603. As the airflow progresses through grill 601, it impinges on diverter plates 605. Diverter plates 605 turn the exiting airflow to a more horizontal direction. Turning the airflow toward a more horizontal direction helps to prevent or reduce any mixing of exit air with inlet air.

Air exhausted from cabinet 100 through grill 601 is warmer and more humid than outside ambient air. The efficiency of air conditioning equipment is negatively effected when the entering outside air is warmer. Therefore, it is an advantage to prevent mixing of warmer humid exhaust air with cooler ambient inlet air.

The configuration of grill 601 provides a number of advantages. As previously described, guide plates 603 help to direct the exiting airflow away from cabinet 100, thereby reducing mixing of exhaust and inlet air. Additionally, the angle orientation of the guide plates is similar to louvers in a shutter which helps to prevent entry of precipitation. Diverter plates 605 provide the previously described turning of the exit airflow and additionally stiffen guide plates 603. Grill blocking plates 607 serve multiple purposes. One purpose of the grill blocking plates is to provide a vertical exterior surface for grill 601, adding to the pleasing non-industrial appearance of cabinet 100. Another purpose of the grill blocking plates is to further stiffen guide plates 603 and diverter plates 605.

In the above description of construction details of cabinet 100, air conditioning equipment has been described. However, other types of air handling equipment are equally appropriate for cabinet 100. For example, some applications may not require compressor powered air conditioning equipment, but may require a heat exchanger, such as an air-to-air heat exchanger, or a liquid-to-air heat exchanger. Thus, cabinet 100 is suitable for many air handling apparatus, and the same or similar hook, slot, and seal configurations are applicable for inter-connection of panels and attachment of the cabinet to an enclosure.

Figure 4:
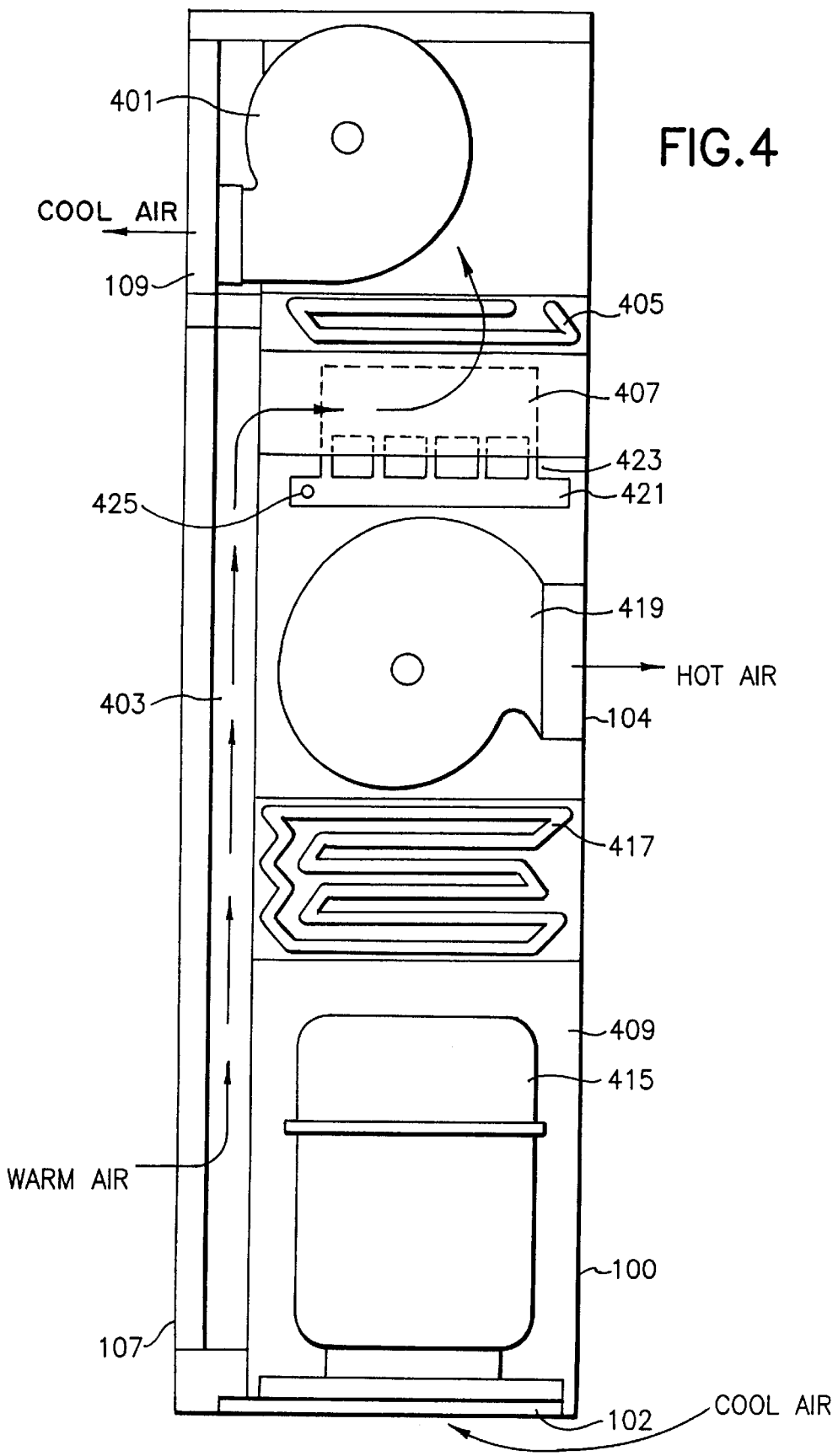
FIG. 4 illustrates a cut-away view of an embodiment of a cabinet and air handling equipment of the invention.

FIG. 4 illustrates a cut-away view of air handling equipment and the interrelationship of that equipment inside cabinet 100. At the top of cabinet 100, an evaporator blower 401 pulls a flow of conditioned air from an internal circulation region 403 in cabinet 100 and directs the flow into enclosure 103. The conditioned air is passed from cabinet 100 to enclosure 103 through air outlet 109. Evaporator blower 401 is within internal circulation region 403 and when operating, creates a pressure differential between the cabinet and the enclosure, thereby creating an airflow from enclosure 103 through air inlet 107 of cabinet 100, vertically through internal circulation region 403 and back into enclosure 103 through air outlet 109.

As the airflow moves from inlet 107 to outlet 109, the air flows vertically through evaporator coil 405. Evaporator coil 405, which is below evaporator blower 401, is an evaporated gas to air heat exchange coil, as typically used in the air conditioning field.

As illustrated in FIG. 4, evaporator coil 405 is generally planar, with airflow passages from one side of the planar coil to the other side of the planar coil. In the configuration of FIG. 4, planar evaporator coil 405 is horizontally disposed within cabinet 100, while located substantially below evaporator blower 401. The horizontal position of coil 405 has a number of advantages. One advantage is that coil 405 can have a large surface or face area. With a vertical airflow through coil 405, it is possible to have almost the entire cross section area of cabinet 100 filled by coil 405. This allows the horizontal dimensions of coil 405 to be substantially the same as the horizontal dimensions of the interior circulation region 403 of the cabinet. This larger surface or face area of coil 405 allows greater air mass flow through coil 405 while not exceeding a critical velocity through coil 405. Critical velocity for an evaporator coil is the velocity at which the airflow dislodges condensate from the surface of the coils.

In another advantage, the configuration of FIG. 4 helps to ensure that condensate formed on evaporator coil 405 does not enter enclosure 103. Condensate that is formed on evaporator coil 405 will generally collect and drip down as a result of gravity, and therefore away from evaporator blower 401. Counter-acting the drip of condensate from evaporator coil 405, the airflow within the internal circulation region 403 of cabinet 100 is vertical through evaporator coil 405. With a sufficiently high airflow velocity through evaporator coil 405, condensate can be lifted from coil 405 and thus pass through blower 401 and into enclosure 103. However, with a horizontal orientation and larger face area, the airflow velocity through coil 405 can be lower and condensate will drip from coil 405 rather than being blown off coil 405.

Condensate formed on evaporator coil 405 drips by gravity into condensate pan 407. Condensate pan 407 is located sufficiently below coil 405 to allow airflow to enter coil 405 at the lower surface and exit coil 405 at the upper surface.

Internal circulation region 403 of cabinet 100 provides a generally closed path for air entering the bottom of cabinet 100 at inlet 107 and exiting cabinet 100 at outlet 109. Internal circulation region 403 is substantially isolated from external circulation region 409, also in cabinet 100.

External circulation region 409 of cabinet 100 provides a path for outside air entering the bottom of cabinet 100 at external circulation region inlet vent 102 and leaving at exhaust vent 104. As outside air travels through external circulation region 409 of cabinet 100, the air first flows vertically around compressor 415, which is located at the bottom of cabinet 100 just above vent 102. This entering airflow, which is generally at ambient air temperature, helps to cool compressor 415.

After flowing around compressor 415, the airflow has increased in temperature by a few degrees and it passes through air passages in condenser coil 417. Condenser coil 417 carries hot compressed refrigerant liquid which is many degrees above ambient air temperature. This condensing refrigerant flows through passages in condenser coil 417 and heat in the condensing refrigerant is transferred to the airflow passing through coil 417. As a result, heat in the condensing refrigerant is transferred to the airflow, causing the airflow temperature to increase as it passes through condenser coil 417. The airflow continues vertically around condenser blower 419, where it is eventually discharged from external circulation region 409 through exhaust vent 104 after passing through condenser blower 419. Blower 419 creates significant turbulence around condensate evaporator pan 421, assisting with evaporation and removal of humid air.

Condensate evaporator pan 421 is within external circulation region 409 and is below condensate pan 407. Condensate pan 407 is within internal circulation region 403. A condensate passage 423 connects condensate pan 407 with condensate evaporator pan 421. Condensate passage 423 thus creates a connection between internal circulation region 403 and external circulation region 409. Condensate that forms on evaporator coil 405 and drips into condensate pan 407 will flow into condensate evaporator pan 421 through condensate passage 423. Once condensate formed on evaporator coil 405 reaches condensate evaporator pan 421, the condensate is heated by the turbulent heated airflow around condenser blower 419 within external circulation region 409. This combination of airflow and heating of the condensate in condensate evaporator pan 421 assists in evaporation of the condensate. Once evaporated, the condensate is discharged from cabinet 100 as part of the heated airflow that exits the cabinet through exhaust vent 104.

Evaporation of the condensate in condensate evaporator pan 421 is greatly facilitated by a loop of condenser coil 425 which passes through condensate evaporator pan 421. The loop of condenser coil 425 that passes through pan 421 carries hot compressed gas refrigerant after the refrigerant leaves compressor 415 and before the refrigerant enters condenser coil 417. Placement of this loop of condenser coil 425 in pan 421 has the advantage of significantly raising the temperature of the condensate. Thus condenser coil 425 running through condensate evaporator pan 421 provides the advantage of more efficient heat transfer while facilitating evaporation of condensate.

In another advantage of the configuration, condensate evaporator pan 421 is horizontally located directly below condensate pan 407 and above condenser blower 419. This location has the advantage of allowing condensate evaporator pan 421 to have horizontal dimensions substantially equal to the horizontal dimensions of the external circulation region of cabinet 100. This provides a very large surface area, and because condensate evaporation is a function of surface area, this configuration provides enhanced evaporative efficiency.

As illustrated in FIG. 4, individual air conditioning components in cabinet 100 are vertically stacked. This has one advantage of providing a cabinet with a pleasing non-industrial appearance that does not extend substantially beyond enclosure 103. Another advantage of vertically stacked components is that air flows around components, thereby helping to transfer heat to or from those components. As an example, the outside airflow that enters cabinet 100 through external circulation region inlet vent 102 flows around compressor 415. This helps to cool compressor 415. As the airflow continues an upward path, it next flows through condenser coil 417, where heat is transferred from the coils and condensing refrigerant within the coils to the airflow. After leaving coil 417, the airflow continues in an upward path add flows around condenser blower 419 before exiting the cabinet through exhaust vent 104. Before discharge through vent 104, the now-heated air that is flowing around blower 419 is highly turbulent and flows over and around condensate evaporator pan 421, further assisting with evaporation of the condensate.

Within internal circulation region 403, warm and humid recirculation airflow from enclosure 103 enters cabinet 100 through air inlet 107. This airflow travels upward and enters horizontal evaporator coil 405 through the lower surface or face and continues upward, exiting coil 405 through the upper surface or face. As the recirculation airflow moves through coil 405, the air is cooled by the cold evaporated refrigerant in coil 405. The decrease in air temperature normally reduces the air temperature below the dew point, and condensate is formed on evaporator coil 405. Formation of condensate removes moisture from the recirculated air and effectively reduces the humidity level in the recirculation airflow. As a result of the cooling and dehumidification that occurs through coil 405, cooled dehumidified air is passed through air outlet 109 by evaporator blower 401 and is recirculated to enclosure 103.

The configuration of condensate pan 407 above condensate evaporator pan 421 allows gravity transfer of condensate from pan 407 to pan 421 through condensate passage 423. The configuration of horizontal evaporator coil 405 above condensate pan 407 allows gravity drip of condensate from coil 405 into pan 407. Horizontal configuration of coil 405 also allows vertical airflow through coil 405.

In a configuration where the evaporator coil is vertically oriented, any condensate formed on the coil will drip lengthwise down through the coil before dripping off the coil. In a configuration where the evaporator coil is horizontally oriented, any condensate formed on the coil need only drip through the shorter dimension of the coil before dripping off the coil Thus, a horizontal configuration of evaporator coil 405 helps to ensure that condensate will drip from coil 405 in a short path rather than a long path. The configuration of coil 405 below evaporator blower 401 also has the advantage of reducing the possibility that condensate will blow off coil 405 into enclosure 103.

Although illustrative embodiments have been described herein in detail, it should be noted and will be appreciated by those skilled in the art that numerous variations may be made within the scope of this invention without departing from the principle of this invention and without sacrificing its chief advantages. Such variations include the substitution of a refrigerant-free heat exchanger for the refrigeration system described above. It is also possible that a sealant is used between mounting plate 105 and enclosure 103. It is also possible that seal 309 is attached to cabinet 100 with screws or other fixture means. It is also possible that the mounting bracket (e.g. hooks 303) are integral parts of cabinet 100. Alternatively, it is possible that the mounting bracket is not part of either plate 105 or cabinet 100 but cooperates with plate 105 and cabinet 100 to accomplish the same result, which is to connect cabinet 100 to plate 105 while at the same time drawing cabinet 100 closer to enclosure 103, thereby creating or enhancing a seal between cabinet 100 and enclosure 103. It is also possible that an environmental seal is created between cabinet 100 and plate 105, which creates an environmental seal because of a close cooperation and seal between plate 105 and enclosure 103. It is also possible that seal 505 is attached to side panels 108 instead of rear panels 110, 111 or top panel 106. It is also possible that hoots 501 and slots 503 are interchanged between panels 106, 108, 110, 111, or that hooks 501 and slots 503 are independent of panels 106, 108, 110, 111 and cooperate with the panels to achieve the environmental seal through a combined relative movement of the panels along and toward each other. It is also possible to have the loop of condenser coil 425 pass through pan 421 after condenser coil 417.

The terms and expressions have been used herein as terms of description and not terms of limitation. There is no intention to use the terms or expressions to exclude any equivalents of features shown and described or portions thereof and this invention should be defined in accordance with the claims which follow.

We claim:

1. An air handling apparatus comprising:
   a mounting plate, the plate adapted to attach to an enclosure;
   a cabinet, the cabinet adapted to connect to the mounting plate and the cabinet adapted to contact the enclosure;
   at least one mounting bracket, the bracket cooperating between the mounting plate and the cabinet to thereby connect the cabinet to the mounting plate; and
   at least one latching screw, the screw moving the cabinet relative to the mounting plate in a combined direction toward the enclosure and along the enclosure, the mounting plate and mounting bracket substantially concealed by the cabinet when the cabinet is connected to the mounting plate.

2. An air handling apparatus according to claim 1, further comprising a seal, the seal cooperating with the cabinet and the enclosure.

3. An air handling apparatus according to claim 1, the mounting bracket including a hook.

4. An air handling apparatus according to claim 1, the mounting bracket including a slot.

5. An air handling apparatus according to claim 1, the mounting bracket part of the mounting plate.

6. An air handling apparatus according to claim 1, the mounting bracket part of the cabinet.

7. An air handling apparatus according to claim 1, the cabinet hanging on the mounting plate substantially by the mounting bracket.

8. An air handling apparatus according to claim 1, wherein the air handling apparatus includes air conditioning apparatus.

9. An air handling apparatus according to claim 1, wherein the air handling apparatus includes air-to-air heat exchange apparatus.

10. An air handling apparatus according to claim 1, wherein the air handling apparatus includes liquid-to-air heat exchange apparatus.

11. An air handling apparatus comprising:
    a mounting plate, the plate adapted to attach to an enclosure;
    a cabinet, the cabinet adapted to connect to the mounting plate and the cabinet adapted to contact the enclosure;
    at least one mounting bracket, the bracket cooperating between the mounting plate and the cabinet to thereby connect the cabinet to the mounting plate, the mounting plate and mounting bracket substantially concealed by the cabinet when the cabinet is connected to the mounting plate;
    a seal, the seal cooperating with the cabinet and the enclosure; and
    at least one latching screw, the screw moving the cabinet relative to the mounting plate in a combined direction toward the enclosure and along the enclosure.

12. An air handling apparatus according to claim 11, the mounting bracket including a hook.

13. An air handling apparatus according to claim 11, the mounting bracket including a slot.

14. An air handling apparatus according to claim 11, the mounting bracket part of the mounting plate.

15. An air handling apparatus according to claim 11, the mounting bracket part of the cabinet.

16. An air handling apparatus according to claim 11, the cabinet hanging on the mounting plate substantially by the mounting bracket.

17. An air handling apparatus according to claim 11, wherein the air handling apparatus includes air conditioning apparatus.

18. An air handling apparatus according to claim 11, wherein the air handling apparatus includes air-to-air heat exchange apparatus.

19. An air handling apparatus according to claim 11, wherein the air handling apparatus includes liquid-to-air heat exchange apparatus.

20. A method for attaching an air handling cabinet to an enclosure with a mounting plate and at least one mounting bracket, the method comprising:
    attaching the mounting plate to the enclosure;
    engaging the cabinet to the mounting plate using the mounting bracket; and
    securing the cabinet to the mounting plate with a latching screw, the screw moving the cabinet relative to the mounting plate, the movement a combined direction toward the enclosure and along the enclosure, the mounting plate and mounting bracket substantially concealed by the cabinet when the cabinet is connected to the mounting plate.

21. A method according to claim 20, wherein securing the cabinet includes compressing a seal between the cabinet and the enclosure.

22. A method according to claim 20, wherein securing the cabinet results in the cabinet and the enclosure substantially contacting each other so as to substantially seal the cabinet to the enclosure.

23. A method according to claim 20, wherein securing the cabinet results in the cabinet and the mounting plate substantially contacting each other so as to substantially seal the cabinet to the mounting plate.

24. A method according to claim 20, wherein the cabinet contains an air conditioning apparatus.

25. A method according to claim 20, wherein the cabinet contains an air-to-air heat exchange apparatus.

26. A method according to claim 20, wherein the cabinet contains a liquid-to-air heat exchange apparatus.

27. A method for attaching an air handling cabinet to an enclosure with a mounting plate and at least one mounting bracket, the method comprising:
    attaching the mounting plate to the enclosure;
    engaging the cabinet to the mounting plate using the mounting bracket, the mounting plate and mounting bracket substantially concealed by the cabinet when the cabinet is engaged to the mounting plate;
    securing the cabinet to the mounting plate with a latching screw, the screw moving the cabinet relative to the mounting plate, the movement being a combined direction toward the enclosure and along the enclosure; and
    sealing the cabinet to the enclosure with a seal wherein sealing the cabinet includes compressing the seal between the cabinet and the enclosure.

28. A method according to claim 27, wherein sealing the cabinet to the enclosure results in the cabinet, the seal and the enclosure contacting each other so as to substantially seal the cabinet to the enclosure.

29. A method according to claim 27, wherein sealing the cabinet to the enclosure results in the cabinet, the seal and the mounting plate contacting each other so as to substantially seal the cabinet to the mounting plate.

30. A method according to claim 27, wherein the cabinet contains air conditioning apparatus.

31. A method according to claim 27, wherein the cabinet contains air-to-air heat exchange apparatus.

32. A method according to claim 27, wherein the cabinet contains liquid-to-air heat exchange apparatus.

33. An air handling apparatus comprising:
a mounting plate;
means for attaching the mounting plate to an enclosure;
a cabinet; and
means for latching the cabinet to the mounting plate, the means for latching cooperating between the mounting plate and the cabinet, the cabinet concealing the mounting plate when the cabinet is latched to the mounting plate, wherein the means for latching the cabinet to the mounting plate includes means for moving the cabinet relative to the mounting plate, the movement being in a combined direction toward the enclosure and along the enclosure.

34. An air handling apparatus according to claim 33, further comprising means for sealing the cabinet to the enclosure.

35. An air handling apparatus according to claim 33, further comprising means for connecting the cabinet to the mounting plate.

36. An air handling apparatus according to claim 35, wherein the means for connecting includes at least one hook.

37. An air handling apparatus according to claim 35, wherein the means for connecting includes at least one slot.

38. An air handling apparatus according to claim 35, wherein the means for connecting is part of the mounting bracket.

39. An air handling apparatus according to claim 35, wherein the means for connecting is part of the cabinet.

40. An air handling apparatus according to claim 35, wherein the cabinet contains air conditioning apparatus.

41. An air handling apparatus according to claim 35, wherein the cabinet contains air-to-air heat exchange apparatus.

42. An air handling apparatus according to claim 35, wherein the cabinet contains liquid-to-air heat exchange apparatus.

43. An air handling apparatus comprising:
a mounting plate;
means for attaching the mounting plate to an enclosure;
a cabinet;
means for connecting and sealing the cabinet to the enclosure, the cabinet concealing the mounting plate when the cabinet is connected to the mounting plate; and
means for latching the cabinet to the mounting plate, the means for latching including means for moving the cabinet relative to the mounting plate, the movement being in a combined direction toward the enclosure and along the enclosure.

44. An air handling apparatus, comprising:
a mounting plate;
means for attaching the mounting plate to an enclosure;
a cabinet; and
means for connecting and sealing the cabinet to the enclosure including a compressible environmental seal, the cabinet concealing the mounting plate when the cabinet is connected to the mounting plate.

45. An air handling apparatus according to claim 43, wherein the means for connecting and sealing includes at least one hook.

46. An air handling apparatus according to claim 43, wherein the means for connecting and sealing includes at least one slot.

47. An air handling apparatus according to claim 43, wherein the means for connecting and sealing is part of the mounting plate.

48. An air handling apparatus according to claim 43, wherein the means for connecting and sealing is part of the cabinet.

49. An air handling apparatus according to claim 43, wherein the cabinet hangs on the enclosure substantially by the means for connecting and sealing.

50. An air handling apparatus according to claim 43, wherein the cabinet contains air conditioning apparatus.

51. An air handling apparatus according to claim 43, wherein the cabinet contains air-to-air heat exchange apparatus.

52. An air handling apparatus according to claim 43, wherein the cabinet contains liquid-to-air heat exchange apparatus.

53. An air conditioning apparatus adapted for mounting to the exterior of an enclosure, the apparatus comprising:
a cabinet; and
air conditioning equipment, the equipment comprising:
a condensate evaporator pan; and
a condenser blower disposed below the condensate evaporator pan, whereby air circulated by the condenser blower blows around condensate in the condensate evaporator pan.

54. An air conditioning apparatus adapted for mounting to the exterior of an enclosure, the apparatus comprising:
a cabinet; and
air conditioning equipment, the equipment comprising:
a horizontally oriented evaporator coil;
a condensate evaporator pan disposed below the evaporator coil to contain condensate;
a condenser coil loop running through the condensate evaporator pan; and
a condenser blower disposed below the condensate evaporator pan,
whereby heat from the condenser coil loop is transferred to the condensate to increase the temperature of the condensate and assist with evaporation of the condensate, and evaporated condensate is mixed with air circulated by the condenser blower.

55. An air handling apparatus comprising:
a seal;
a first panel;
a second panel; and
a mounting bracket; the mounting bracket cooperating with the first and second panel and compressing the seal between the first and second panels by allowing movement of the first panel along and toward the second panel, the mounting bracket thereby connecting the first panel to the second panel.

56. An air handling apparatus according to claim 55, the mounting bracket including hooks and slots.

57. An air handling apparatus, comprising:
a seal made from a compressible material for creating an environmental seal to substantially prevent passage of precipitation and airflow;
a first panel;
a second panel; and
a mounting bracket; the mounting bracket cooperating with the first and second panel and compressing the seal between the first and second panels by allowing movement of the first panel along and toward the second panel, the mounting bracket thereby connecting the first panel to the second panel.

58. An air handling apparatus according to claim 55, wherein the seal is adhesively attached to the first panel.

59. An air handling apparatus according to claim 55, wherein the seal is adhesively attached to the second panel.

60. An air handling apparatus according to claim 55, wherein the seal is adhesively attached to the mounting bracket.

61. An air handling apparatus according to claim 55, wherein the seal is a compressible material for creating an environmental seal to substantially prevent passage of precipitation and airflow.

62. An air handling apparatus according to claim 55, wherein the air handling apparatus includes air conditioning apparatus.

63. An air handling apparatus according to claim 55, wherein the air handling apparatus includes air-to-air heat exchange apparatus.

64. An air handling apparatus according to claim 55, wherein the air handling apparatus includes liquid-to-air heat exchange apparatus.

65. An air handling apparatus adapted for mounting to the exterior of an enclosure, the apparatus comprising:
   equipment for handling air; and
   an exterior cabinet for housing the equipment, the cabinet comprising:
      a seal;
      a first panel;
      a second panel; and
      a mounting bracket; the mounting bracket cooperating with the first and second panel and compressing the seal between the first and second panels by allowing movement of the first panel along and toward the second panel, the mounting bracket thereby connecting the first panel to the second panel.

66. An air handling apparatus adapted for mounting to the exterior of an enclosure, the apparatus comprising:
   equipment for handling air; and
   an exterior cabinet for housing the equipment, the cabinet comprising:
      a seal;
      a first panel;
      a plurality of slots in the first panel;
      a second panel; and
      a plurality of hooks in the second panel, the hooks cooperating with the slots to compress the seal between the first and second panels by allowing movement of the first panel along and toward the second panel to thereby connect the first panel and the second panel.

67. An injection molded plastic grill of an air handling apparatus adapted for mounting to the exterior of an enclosure, the grill comprising:
   a plurality of guide plates, the guide plates angled between approximately 25 degrees and 65 degrees from vertical when the grill is vertically mounted in the air handling apparatus;
   a plurality of diverter plates, the diverter plates connected to the guide plates and angled between approximately 70 and 110 degrees from vertical when the grill is vertically mounted in the air handling apparatus; and
   a plurality of blocking plates, the blocking plates connected to the diverter plates and angled between approximately 0 and 20 degrees from vertical when the grill is vertically mounted in the air handling apparatus, whereby the combination of guide plates, diverter plates and blocking plates turn a downward angled airflow through the grill to a substantially horizontal airflow.

68. An air handling apparatus adapted for mounting to the exterior of an enclosure, the apparatus comprising:
   an exterior cabinet; and
   an injection molded plastic grill for directing an airflow from the cabinet, the grill comprising:
      a plurality of guide plates, the guide plates angled between approximately 25 degrees and 65 degrees from vertical when the grill is vertically mounted in the cabinet;
      a plurality of diverter plates, the diverter plates connected to the guide plates and angled between approximately 70 and 110 degrees from vertical when the grill is vertically mounted in the cabinet; and
      a plurality of blocking plates, the blocking plates connected to the diverter plates and angled between approximately 0 and 20 degrees from vertical when the grill is vertically mounted in the cabinet, whereby the combination of guide plates, diverter plates and blocking plates turn a downward angled airflow through the grill to a substantially horizontal airflow.

* * * * *